United States Patent
Chiang et al.

(10) Patent No.: US 9,614,395 B2
(45) Date of Patent: Apr. 4, 2017

(54) WIRELESS CHARGING SYSTEM AND FOREIGN METAL OBJECT DETECTION METHOD FOR THE SYSTEM

(71) Applicant: AUTOMOTIVE RESEARCH & TESTING CENTER, Changhua Hsien (TW)

(72) Inventors: Chao-Wen Chiang, Changhua Hsien (TW); Yu-Chuan Wang, Changhua Hsien (TW)

(73) Assignee: Automotive Research & Testing Center, Changhua Hsien (TW)

( * ) Notice: Subject to any disclaimer, the term of this patent is extended or adjusted under 35 U.S.C. 154(b) by 221 days.

(21) Appl. No.: 14/586,248

(22) Filed: Dec. 30, 2014

(65) Prior Publication Data

US 2016/0190852 A1    Jun. 30, 2016

(51) Int. Cl.
| | |
|---|---|
| *H02J 7/00* | (2006.01) |
| *H02J 7/02* | (2016.01) |
| *G01V 3/12* | (2006.01) |
| *G01R 25/00* | (2006.01) |
| *H02J 50/10* | (2016.01) |
| *H02J 50/60* | (2016.01) |
| *G01V 3/08* | (2006.01) |

(52) U.S. Cl.
CPC ............ *H02J 7/025* (2013.01); *G01R 25/005* (2013.01); *G01V 3/088* (2013.01); *G01V 3/12* (2013.01); *H02J 50/10* (2016.02); *H02J 50/60* (2016.02)

(58) Field of Classification Search
CPC . Y02E 60/12; H02J 7/025; H02J 50/10; H02J 50/60; H01F 38/14; Y02T 90/122; B60L 11/182; G01V 3/08; G01V 3/12; G01R 25/005
USPC .......................................................... 320/108
See application file for complete search history.

(56) References Cited

U.S. PATENT DOCUMENTS

| | | | | |
|---|---|---|---|---|
| 5,157,319 A | * | 10/1992 | Klontz ................ | B60L 11/1816 320/108 |
| 2004/0222857 A1 | * | 11/2004 | Adkisson .................. | G06F 1/12 331/25 |

(Continued)

FOREIGN PATENT DOCUMENTS

TW        201415064 A        4/2014

*Primary Examiner* — Yalkew Fantu
*Assistant Examiner* — Mohammed J Sharief
(74) *Attorney, Agent, or Firm* — Birch, Stewart, Kolasch & Birch, LLP

(57) ABSTRACT

A wireless charging system includes a wireless charging device and a power-consuming device installed in a charging area. The wireless charging device has a signal conversion module connected to a controller, a transmitter antenna and a power input terminal. The power-consuming device has a receiver coil connected to a rectifier and outputting generated power through a power output terminal. Before or when the wireless charging device charges the power-consuming device, the controller of the wireless charging device can detect a power consumption status, voltage and current information and phase difference information of the transmitter antenna to instantly determine if any foreign metal object enters the charging area, thereby preventing high temperature generated by the foreign metal object from causing equipment damage and danger and enhancing wireless charging safety.

16 Claims, 6 Drawing Sheets

(56) References Cited

U.S. PATENT DOCUMENTS

| | | | | |
|---|---|---|---|---|
| 2012/0139356 A1* | 6/2012 | Jung | ............... | H02J 7/025 |
| | | | | 307/104 |
| 2012/0299531 A1* | 11/2012 | Prosser | ............ | H02J 7/0054 |
| | | | | 320/104 |
| 2013/0035814 A1* | 2/2013 | Boyer | ............ | B60L 11/1816 |
| | | | | 701/22 |
| 2013/0057079 A1* | 3/2013 | Park | ............... | H02J 7/00 |
| | | | | 307/104 |
| 2013/0187478 A1* | 7/2013 | Bae | ............... | H02J 5/005 |
| | | | | 307/104 |
| 2014/0239891 A1* | 8/2014 | Martin | ............ | B60L 11/182 |
| | | | | 320/108 |
| 2015/0177293 A1* | 6/2015 | McFarthing | ......... | G01R 21/06 |
| | | | | 340/870.3 |
| 2015/0333797 A1* | 11/2015 | Nejatali | ........... | H04B 5/0043 |
| | | | | 375/376 |

\* cited by examiner

WIRELESS CHARGING SYSTEM AND FOREIGN METAL OBJECT DETECTION METHOD FOR THE SYSTEM

BACKGROUND OF THE INVENTION

1. Field of the Invention

The present invention relates to a wireless charging system and, more particularly, to a wireless charging system with foreign metal object detection capability and a foreign metal detection method for the system.

2. Description of the Related Art

Wireless charging by far mainly relies on technique associated with near-field magnetic induction, which is characterized by a wireless charger applied in a preset charging area to transfer power to power-consuming equipment. The power-consuming equipment charges a battery thereof and supplies itself for operation with the received power. The concept behind the wireless power transfer resides in that the wireless charger is built in with a coil with AC (Alternating Current) current passing through the coil in generation an AC magnetic field and electrical energy is transferred from the AC magnetic field to a coil in the power-consuming equipment and stored in a battery of the power-consuming equipment. Wireless charging certainly increases operational convenience of power-consuming equipment in charging. However, when any foreign metal object enters the charging area, there is a high chance of damage to the power-consuming equipment and a great danger arising from high temperature generated by the foreign metal object during wireless charging.

Currently, foreign object detection technique for wireless charging can be classified into two types, namely, technique using external sensor, such as coil, ultrasonic sensor, infrared sensor and the like, and technique using power transmission coil. The technique using external sensor detects foreign object on a surface of the antenna at the transmitter side while the external sensor affects the power transmission performance of the wireless charging system due to mutual interaction, such that such technique is only appropriate to detection prior to charging. The technique using power transmission coil determines existence of foreign object depending on variations of measured parameters. The measured parameters include transmission power, transmission efficiency, S-parameter, quality factor and the like. However, those parameters are all subject to unmeasurable variations arising from changes in transmission distance, and are not accurate for determining if foreign object actually exists.

As disclosed in Taiwan Patent Publication No. 201415064, entitled "Systems, methods and apparatus for detecting foreign objects", an apparatus for detecting a presence of an object in a magnetic field is provided. The apparatus includes a power circuit configured to generate the magnetic field and transfer power wirelessly at a level sufficient to supply power to or charge a load via the magnetic field, and the magnetic field causes a vibration of the object. The apparatus further includes a detection circuit configured to transmit signals and detect if the object exists based on a reflection of the transmitted signals and a difference between a measured characteristic and a corresponding characteristic of a frequency of the vibration of the object caused by the magnetic field.

As can be seen from the foregoing conventional technique, should any foreign metal object enter a charging area, there is a high likelihood that the high temperature generated by the foreign metal object during charging will damage the equipment in charging and cause danger to surrounding people. However, in the conventional techniques the external sensor could readily affect power transmission performance, and the power transmission coil for detecting foreign objects fails to accurately detect a presence of foreign objects when transmission distance varies. Although the conventional techniques detect the presence of foreign objects through variation of measured resonant frequency, the resultant element structure tends to be complicated and thus results in the production cost increase and the conventional techniques fails to perform accurate foreign object detection.

SUMMARY OF THE INVENTION

An objective of the present invention is to provide a wireless charging system and a foreign metal object detection method for the system that can be applied prior to or during wireless charging to instantly, effectively and accurately detect if any foreign metal object enters a charging area in a low-cost and transmission distance independent manner, ensuring that no damage and danger are caused by high temperature generated by the foreign metal object.

To achieve the foregoing objective, the foreign metal object detection method for a wireless charging system is performed by a wireless charging device to transmit an electromagnetic signal to a power-consuming device. The method has steps of:

receiving at least one set of voltage and current information and phase difference information associated with the at least one set of voltage and current information;

determining if a variation of the at least one set of voltage and current information and a variation of the phase difference information fall outside a safe range; and performing an emergency response measure when the variation of the at least one set of voltage and current information and the variation of the phase difference information fall outside the safe range.

To achieve the foregoing objective, the wireless charging system has a wireless charging device and a power-consuming device.

The wireless charging device has a transmitter controller, a transmitter antenna and a signal conversion module.

The signal conversion module is connected to the transmitter controller and the transmitter antenna, and drives the transmitter antenna to transmit electromagnetic signals for the transmitter controller to detect a power consumption status, voltage and current information and phase difference information associated with the voltage and current information of the transmitted antenna.

The power-consuming device has a rectifier, a receiver coil and a receiver controller.

The receiver coil is connected to the rectifier, senses the electromagnetic signals transmitted from the transmitter antenna of the wireless charging device in generation a current, and outputs the current to a power output terminal through the rectifier. The receiver controller is connected to the rectifier.

When determining that the voltage and current information and the phase difference information associated with the voltage and current information fall outside a safe range, the transmitter controller of the wireless charging device transmits a control signal to the signal conversion module to stop the transmitter antenna from transmitting the electromagnetic signals.

Given the foregoing foreign metal object detection method and the wireless charging system, prior to or during wireless charging, the wireless charging device transmit electromagnetic signals to the power-consuming device and detects if variation of voltage and current information and variation of phase difference information of the wireless charging device fall outside a safe range. If the wireless charging device determines that those variations fall outside the safe range, the wireless charging device performs an emergency response measure to instantly indicate entry of foreign metal object, thereby avoiding equipment damage and danger to surrounding people due to high temperature generated by foreign metal object and enhancing wireless charging safety.

Other objectives, advantages and novel features of the invention will become more apparent from the following detailed description when taken in conjunction with the accompanying drawings.

DETAILED DESCRIPTION OF THE INVENTION

Figure 1:
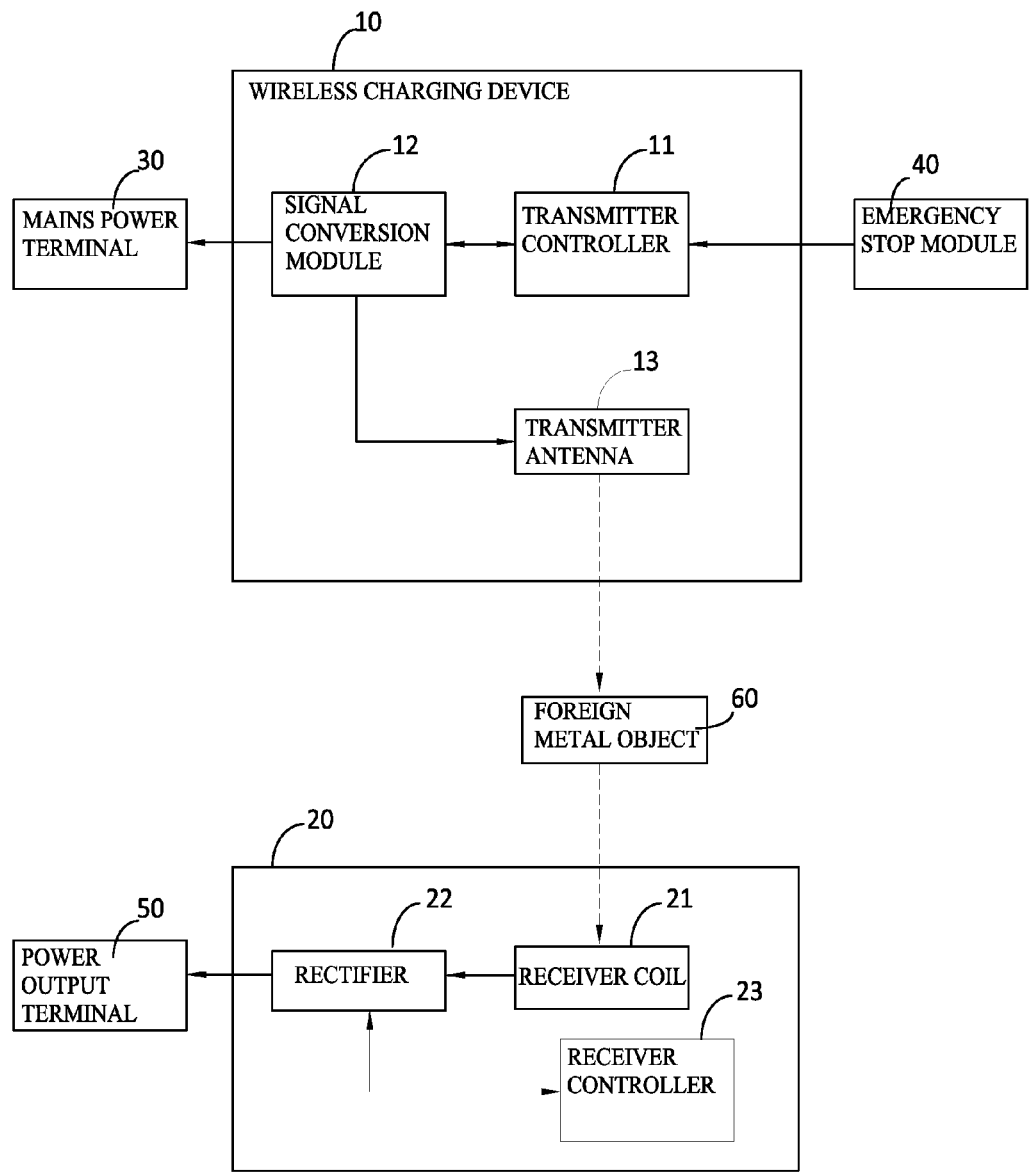
FIG. 1 is a functional block diagram of a first embodiment of a wireless charging system in accordance with the present invention.

With reference to FIG. 1, a wireless charging system in accordance with the present invention includes a wireless charging device 10 and a power-consuming device 20 commonly installed in a charging area.

The wireless charging device 10 detects if at least one foreign metal object 60 enters the charging area, and is connected to an external power terminal 30 and an emergency stop module 40. The power-consuming device 20 is connected to a power output terminal 50. In the present embodiment, in the event that an emergency, such as detection of foreign metal object, and over-temperature condition, over-voltage condition, over-current condition and the like, happens upon operation of the wireless charging system, the wireless charging system sends an instant stop signal to the wireless charging device 10 through the emergency stop module 40 to immediately cease operation of the wireless charging system. It must be pointed out that the wireless charging system can be performed prior to wireless charging or performed in the course of wireless charging. Accordingly, the wireless charging system can be conveniently operated at a flexibly scheduled timing.

The wireless charging device 10 has a transmitter controller 11, a signal conversion module 12 and a transmitter antenna 13. The signal conversion module 12 is connected to the transmitter antenna 13, the transmitter controller 11 and the external power terminal 30 to receive power information from the external power terminal 30 and drive the transmitter antenna 13 for electromagnetic signal transmission. The transmitter controller 11 detects a power consumption status, voltage and current information and phase difference information of the transmitter antenna 13. The transmitter controller 11 is connected to the emergency stop module 40. Before starting wireless charging, the wireless charging device 10 determines a variation of the voltage information and the current information and a variation of the phase difference information associated with the voltage and current information is within a preset safe range according to at least one set of voltage and current information and phase difference information of the transmitter controller 11. When the variation of the voltage information and the current information and the variation of the phase difference information associated with the voltage and current information fall outside the safe range, the wireless charging device 10 then sends a control signal to the signal conversion module 12 for the signal conversion module 12 to stop electromagnetic signal transmission of the transmitter antenna 13, and further sends out an alarm signal.

The power-consuming device 20 has a receiver coil 21, a rectifier 22 and a receiver controller 23. The receiver coil 21 is connected to the rectifier 22. During wireless charging, the receiver coil 21 senses electromagnetic signals transmitted from the transmitter antenna 13 of the wireless charging device 10 in generation of a current, and outputs the current to the power output terminal 50 through the rectifier 22. The receiver controller 23 is connected to the rectifier 22 and detects the current from the rectifier 22, which is receiver-end information. When determining that the variation of the at least one set of voltage and current information and the variation of phase difference information associated with the at least one set of voltage and current information fall outside the safe range, the transmitter controller 11 transmits the control signal to the signal conversion module 12 to immediately stop transmission of electromagnetic signals. Thus, during the course of wireless charging, the wireless charging system can prevent the system from being damaged by the high temperature arising from presence of foreign metal object and running into danger and enhance safety in wireless charging.

Figure 2:
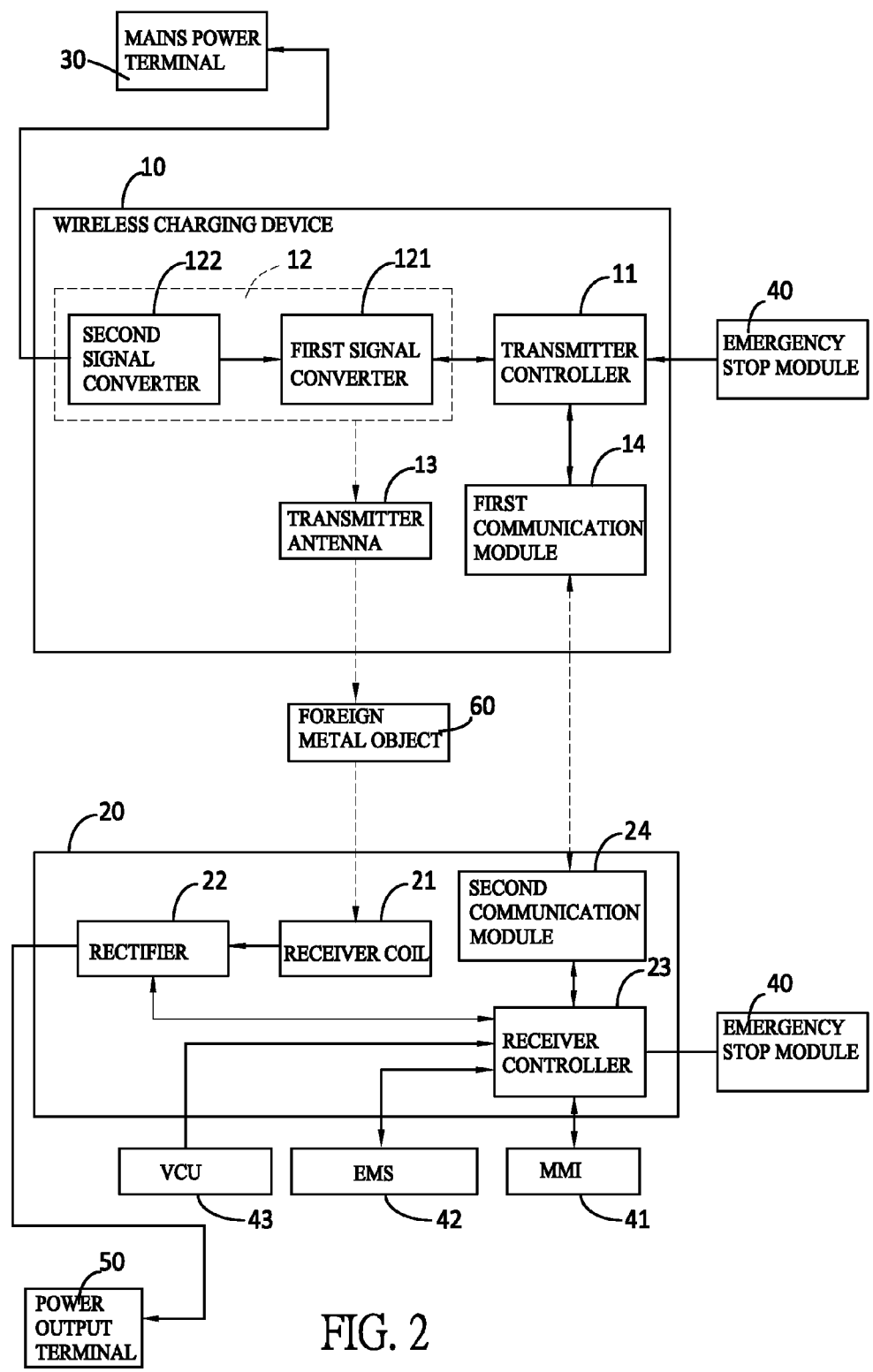
FIG. 2 is a functional block diagram of a second embodiment of a wireless charging system in accordance with the present invention.

With reference to FIG. 2, a second embodiment of a wireless charging system in accordance with the present invention differs from the foregoing embodiment in that the wireless charging device 10 further has a first communication module 14 connected to the transmitter controller 11, the signal conversion module 12 has a first signal converter 121 connected to the transmitter antenna 13 and the transmitter controller 11, and a second signal converter 122 connected between the external power terminal 30 and the first signal converter 121. In the present embodiment, the first converter 121 pertains to a DC (Direct Current) to AC converter, and the second converter 122 pertains to an AC to DC converter. Furthermore, the second embodiment also differs from the foregoing embodiment in that the power-consuming device 20 further has a second communication module 24. The second communication module 24 is connected to the receiver controller 23, and establishes a link with the first communication module 14 using a communication protocol.

For the sake of higher safety of the wireless charging system, the receiver controller 23 of the power-consuming device 20 can be further connected to other external auxiliary systems, such as another emergency stop module 40, a man machine interface (MMI) 41, an energy management system (EMS) 42, a vehicle control unit (VCU) 43 and the like. The emergency stop module 40 can send out an instant stop signal to the power-consuming device to stop operation of the wireless charging system. The MMI 41 allows technical personnel to input instant messages or generate corresponding control commands The EMS 42 distributes power to the power-consuming device 20 on demand to increase power utilization efficacy. The VCU 43 is used for power control, communication diagnostics and system parameter calibration.

Figure 3:
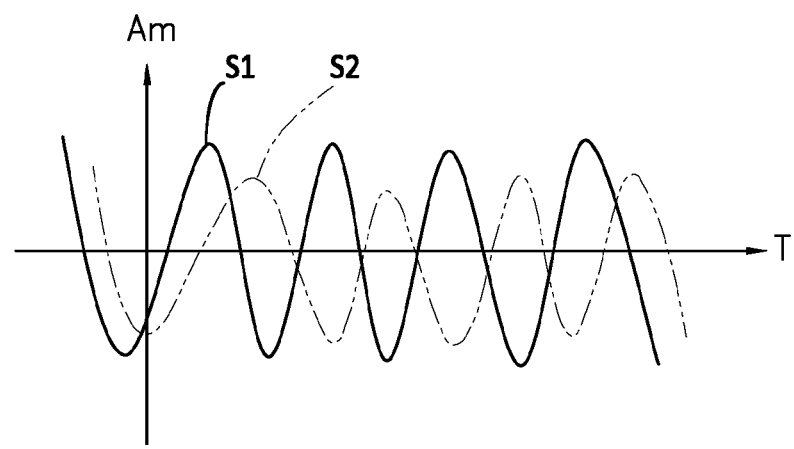
FIG. 3 is a waveform diagram of phase difference information acquired from a waveform diagram of voltage and current information in accordance with the present invention.
Figure 3:
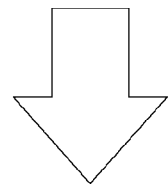
Figure 3:
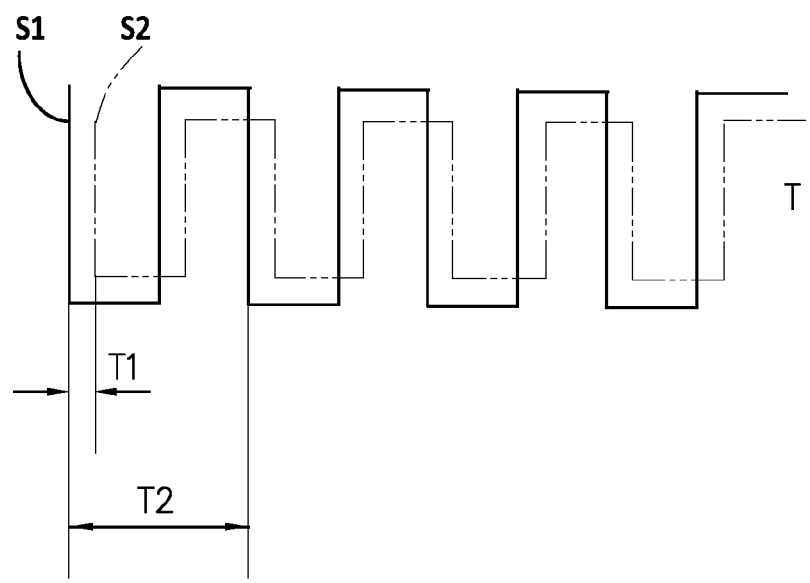

To explain how the wireless charging device 10 calculates the voltage information and current information and the phase difference information associated with the voltage and current information, with reference to FIG. 3, the transmitter controller 11 of the wireless charging device 10 first detects a set of analog signal waveforms associated with voltage and current information of the transmitter antenna 13, in which a horizontal axis represents time T and a vertical axis represents voltage amplitude or current amplitude Am. The set of analog signal waveforms includes a voltage waveform S1 and a current waveform S2 with amplitudes Am continuously varying in time T and respectively representing real impedance values of voltage and current. When those impedance values are all greater than a first safety threshold, the phase difference information associated with the voltage and current information should be simultaneously checked if it is greater than a second safety threshold. In the present embodiment, the first safety threshold and the second safety threshold can be adjusted to be the same or different depending on the actual requirement of the charging environment. The real impedance values and the phase difference information can be configured according to a size of the detected foreign object, and are susceptible to environmental factors and detection sensitivity, such as foreign object detectable when a variation of the impedance value is detected to be 1% or detectable in a more accurate manner when the variation of the impedance value is detected to be 0.1%.

Before calculating the phase difference information, the transmitter controller 11 of the wireless charging device 10 respectively converts the voltage waveform S1 and the current waveform S2 into two square waveforms to generate a more accurate calculation result. A first cycle T1 is defined as a difference between the time at a rising edge (falling edge) of the voltage waveform S1 and the time at a rising edge (falling edge) of the current waveform S2 adjacent thereto, and a second cycle T2 is defined as a complete cycle of the square waveform converted from the current waveform S2. The transmitter controller 11 calculates the phase difference information associated with the voltage and current information according to a ratio of the first cycle T1 over the second cycle T2. In the present embodiment, the phase difference information is calculated by dividing the first cycle T1 by the second cycle T2 to obtain a ratio and multiplying the ratio by 360 degrees.

Figure 4:
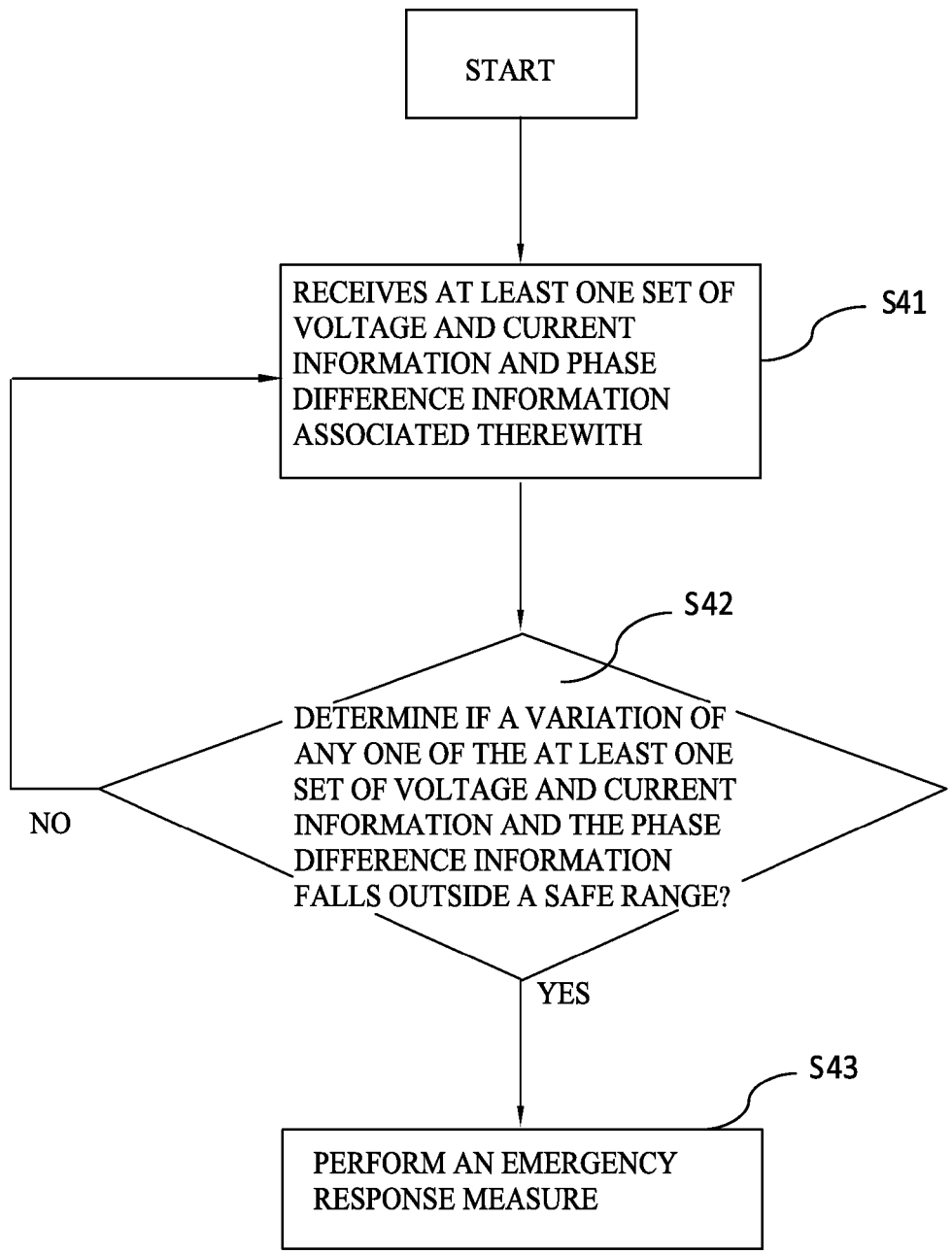
FIG. 4 is a flow diagram of a foreign metal object detection method in accordance with the present invention.

Based on the description of the foregoing embodiments, a foreign metal object detection method for a wireless charging system can be further concluded. The foreign metal object detection method can be performed by a wireless charging device 10 before wireless charging or during the course of wireless charging to transmit an electromagnetic signal from the wireless charging device 10 to a power-consuming device 20, with reference to FIG. 4, and includes the following steps.

Step S41: Receives at least one set of voltage and current information and phase difference information associated with the at least one set of voltage and current information from the transmitter controller 11.

Step S42: Determine if a variation of any one of the at least one set of voltage and current information and the phase difference information falls outside a safe range. If the determination result is positive, perform step S43. Otherwise, resume step S41.

Step S43: Perform an emergency response measure. In the present embodiment, the emergency response measure may issue an alarm message or stopping the transmitter antenna 13 from transmitting electromagnetic signals to the power-consuming device 20. It is noted that when the receiver controller 11 receives multiple sets of voltage and current information and phase difference information thereof, the way of the receiver controller 11 in determining variations of the multiple sets of voltage and current information is the same as that in determining a variation of one set of voltage and current information. Likewise, when any variation is greater than a safe range, the emergency response measure is performed for protection. As long as any set of foreign object(s) is detected in one set of the multiple sets of voltage and current information, the emergency response measure is triggered. There is a likelihood that multiple sets of foreign objects can be detected from the multiple sets of voltage and current information.

Figure 5:
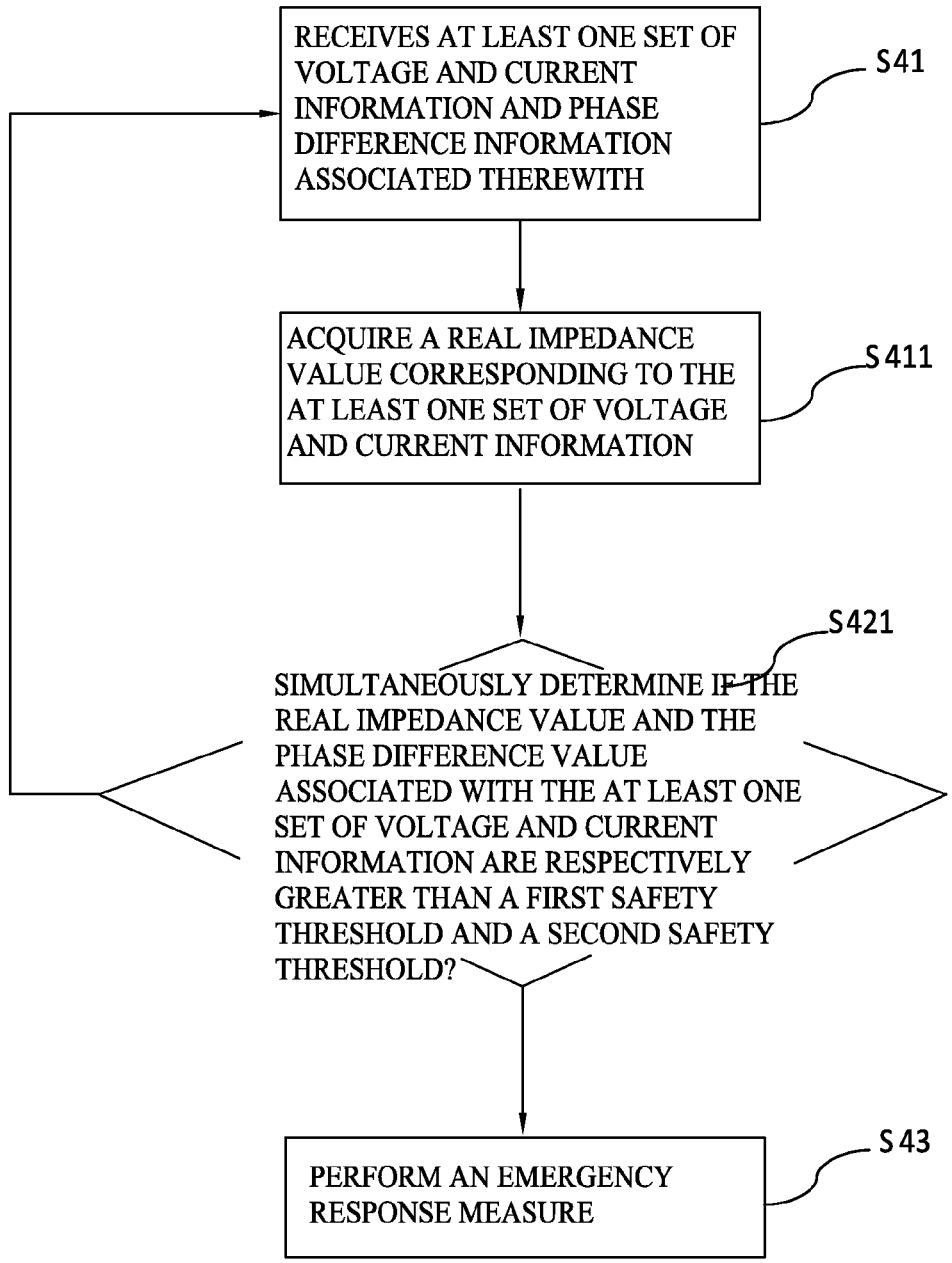
FIG. 5 is a flow diagram of a step of determining foreign metal object in FIG. 4.

When the wireless charging device 10 transmits electromagnetic signals to the power-consuming device 20, the transmitter controller 11 detects the power consumption status, the voltage and current information and the phase difference information of the transmitter antenna 13. When determining that the variation of the at least one set of voltage and current information and the variation of the phase difference information fall outside a safe range, the transmitter controller 11 of the wireless charging device 10 instructs the transmitter antenna 13 to stop transmitting electromagnetic signals. With reference to FIG. 5, the foreign metal object detection method further has the following steps after step S41.

Step S411: Acquire a real impedance value corresponding to the at least one set of voltage and current information.

Step S421: Simultaneously determine if the real impedance value and the phase difference value associated with the at least one set of voltage and current information are respectively greater than a first safety threshold and a second safety threshold. If the determination result is positive, perform the foregoing step S43. Otherwise, resume step S41. The first safety threshold and the second safety threshold can be adjusted to be the same or different according to requirement of the wireless charging environment. The phase difference information can be calculated by dividing the first cycle by the second cycle to obtain a ratio and multiplying the ratio by 360 degrees.

Figure 6:
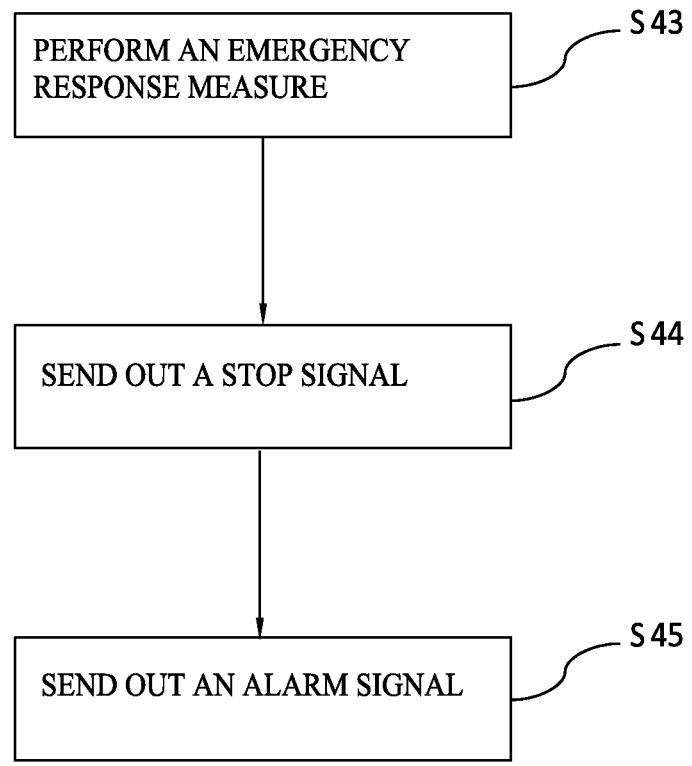
FIG. 6 is a flow diagram of a step of generating alarm signal in FIG. 4.

With reference to FIG. 6, the foreign metal object detection method further has the following steps after step S43.

Step S44: Send out a stop signal from the transmitter antenna 13 to stop the transmitter antenna 13 from transmitting electromagnetic signals to the power-consuming device 20.

Step S45: Send out an alarm signal from the wireless charging device 10.

In sum, the present invention can be applied before or when the wireless charging device 10 charges the power-consuming device 20. The transmitter controller 11 of the wireless charging device 20 can detect the power consumption status, the voltage and current information and the phase difference information to instantly and accurately determine if any foreign metal object enters the charging area, thereby preventing the wireless charging system from being damaged or running into danger due to high temperature generated by the foreign metal object and achieving wireless charging safety with a lower production cost.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A foreign metal object detection method for a wireless charging system performed by a wireless charging device to transmit an electromagnetic signal to a power-consuming device, wherein the wireless charging device is connected to an external power terminal and includes a transmitter controller, a signal conversion module and a transmitter antenna, wherein the signal conversion module is connected to the transmitter antenna, the transmitter controller and the external power terminal; the method comprising steps of:

receiving at least one set of voltage and current information from the external power terminal with the signal conversion module, wherein each set of voltage and current information of the at least one set of voltage and current information includes voltage information and current information, and phase difference information associated with the at least one set of voltage and current information from the transmitter controller, and driving the transmitter antenna with the signal conversion module to transmit an electromagnetic signal to the power-consuming device, wherein the transmitter controller respectively converts a voltage waveform and a current waveform associated with the voltage information and the current information in each set of voltage and current information into a first square waveform and a second square waveform, wherein a first cycle is defined as a difference between time at a rising edge of the first square waveform and time at a rising edge of the second square waveform adjacent thereto, a second cycle is defined as a complete cycle of the second square waveform, wherein the transmitter controller calculates the phase difference information associated with the set of voltage and current information according to a ratio of the first cycle over the second cycle;

determining if a variation of each of the voltage information and the current information in each set of voltage and current information and the phase difference information associated with the set of voltage and current information fall outside a safe range through the transmitter controller; and performing an emergency response measure through the transmitter controller by sending a control signal to the signal conversion module for the signal conversion module to stop the transmitter antenna from transmitting electromagnetic signals and sending out an alarm signal when the variation of each of the voltage information and the current information in each set of voltage and current information and the phase difference information fall outside the safe range.

2. The method as claimed in claim 1, wherein after the step of receiving the at least one set of voltage and current information and the phase difference information associated with the at least one set of voltage and current information, the method further comprises a step of acquiring a real impedance value corresponding to each of the voltage information and the current information in each set of voltage and current information.

3. The method as claimed in claim 2, wherein when performing the step of determining if the variation of each of the voltage information and the current information in each set of voltage and current information and the phase difference information fall outside the safe range, the method further comprises steps of:

simultaneously determining if the variation of the real impedance value associated with each of the voltage information and the current information in each set of voltage and current information is greater than a first safety threshold and the phase difference information associated with the set of voltage and current information is greater than a second safety threshold; and performing the emergency response measure when the variation of the real impedance value associated with each of the voltage information and the current information in each set of voltage and current information is greater than the first safety threshold and the phase difference information associated with the set of voltage and current information is greater than the second safety threshold.

4. A wireless charging system, comprising:

a wireless charging device adapted to be connected to an external power terminal and having:
a transmitter controller;
a transmitter antenna; and
a signal conversion module connected to the external power terminal, the transmitter controller and the transmitter antenna, receiving at least one set of voltage and current information from the external power terminal, wherein each set of voltage and current information of the at least one set of voltage and current information includes voltage information and current information, and driving the transmitter antenna to transmit electromagnetic signals; and a power-consuming device having:
a rectifier;
a receiver controller connected to the rectifier;
a receiver coil connected to the rectifier, sensing the electromagnetic signals transmitted from the transmitter antenna of the wireless charging device in generation of a current, and outputting the current to a power output terminal through the rectifier;

wherein the transmitter controller respectively converts a voltage waveform and a current waveform associated with the voltage information and the current information in each set of voltage and current information of the at least one voltage and current information into a first square waveform and a second square waveform, defines a first cycle as a difference between time at a rising edge of the first square waveform and time at a rising edge of the second waveform adjacent thereto and a second cycle as a complete cycle of the second square waveform, and calculates phase difference information associated with the set of voltage and current information according to a ratio of the first cycle over the second cycle, when determining that a variation of each of the voltage information and the current information in the set of voltage and current information and the phase difference information associated with the set of voltage and current information fall outside a safe range, the transmitter controller of the wireless charging device transmits a control signal to the signal conversion module to stop the transmitter antenna from transmitting the electromagnetic signals and sends out an alarm signal.

5. The wireless charging system as claimed in claim 4, wherein the signal conversion module has:
   a first signal converter connected to the transmitter antenna and the transmitter controller; and
   a second signal converter connected between the first signal converter and a power source.

6. The wireless charging system as claimed in claim 5, wherein
   the wireless charging device further has a first communication module connected to the transmitter controller;
   the power-consuming device further has a second communication module connected to the receiver controller and establishing a link with the first communication module of the wireless charging device using a communication protocol.

7. The wireless charging system as claimed in claim 6, wherein the first signal converter pertains to a DC (Direct Current) to AC (Alternating Current) converter, and the second signal converter pertains to an AC to DC converter.

8. The wireless charging system as claimed in claim 7, wherein the transmitter controller of the wireless charging device is connected to an emergency stop module, and the receiver controller of the power-consuming device is connected to another emergency stop module, a man machine interface, an energy management system or a vehicle control unit.

9. The method as claimed in claim 1, wherein the first cycle is defined as a difference between time at a falling edge of the first square waveform and time at a falling edge of the second square waveform adjacent thereto.

10. The method as claimed in claim 9, wherein after the step of receiving the at least one set of voltage and current information and the phase difference information associated with the at least one set of voltage and current information, the method further comprises a step of acquiring a real impedance value corresponding to each of the voltage information and the current information in each set of voltage and current information.

11. The method as claimed in claim 10, wherein when performing the step of determining if the variation of each of the voltage information and the current information in each set of voltage and current information and the phase difference information falls outside the safe range, the method further comprises steps of:
   simultaneously determining if the variation of each of the real impedance value associated with the voltage information and the current information in each set of voltage and current information is greater than a first safety threshold and the phase difference information associated with the set of voltage and current information is greater than a second safety threshold; and
   performing the emergency response measure when the variation of each of the real impedance value associated with the voltage information and the current information in each set of voltage and current information is greater than the first safety threshold and the phase difference information associated with the set of voltage and current information is greater than the second safety threshold.

12. The system as claimed in claim 4, wherein the first cycle is defined as a difference between time at a falling edge of the first square waveform and time at a falling edge of the second square waveform adjacent thereto.

13. The wireless charging system as claimed in claim 12, wherein the signal conversion module has:
   a first signal converter connected to the transmitter antenna and the transmitter controller; and
   a second signal converter connected between the first signal converter and a power source.

14. The wireless charging system as claimed in claim 13, wherein
   the wireless charging device further has a first communication module connected to the transmitter controller;
   the power-consuming device further has a second communication module connected to the receiver controller and establishing a link with the first communication module of the wireless charging device using a communication protocol.

15. The wireless charging system as claimed in claim 14, wherein the first signal converter pertains to a DC (Direct Current) to AC (Alternating Current) converter, and the second signal converter pertains to an AC to DC converter.

16. The wireless charging system as claimed in claim 15, wherein the transmitter controller of the wireless charging device is connected to an emergency stop module, and the receiver controller of the power-consuming device is connected to another emergency stop module, a man machine interface, an energy management system or a vehicle control unit.

* * * * *